United States Patent [19]

Sunakawa

[11] Patent Number: 4,859,627
[45] Date of Patent: Aug. 22, 1989

[54] GROUP VI DOPING OF III-V SEMICONDUCTORS DURING ALE

[75] Inventor: Haruo Sunakawa, Tokyo, Japan
[73] Assignee: NEC Corporation, Tokyo, Japan
[21] Appl. No.: 214,241
[22] Filed: Jul. 1, 1988
[51] Int. Cl.$^4$ ............................................. H01L 21/205
[52] U.S. Cl. ............................. 437/81; 148/DIG. 40; 148/DIG. 65; 148/DIG. 110; 148/33.1; 156/610; 437/111; 437/126; 437/912; 437/965
[58] Field of Search .................. 148/DIG. 40, 41, 65, 148/72, 110, 169, 33, 33.1, 33.4; 156/610–615; 357/23.2, 16, 15; 437/81, 111, 108, 126, 912, 965, 971

[56] References Cited

U.S. PATENT DOCUMENTS 4,058,430 11/1977 Suntola et al. ..................... 437/105

OTHER PUBLICATIONS

Ozeki et al., "Growth of AlGaAs Using a Pulsed Vapor Phase Method," IEEE Solid State Devices and Materials, 1987, pp. 475–478.
Koboyashi et al., "Flow-Rate Modulation Epitaxy of GaAs," Inst. Phys. Conf. Ser. No. 79 Chapter 13, 1985, pp. 737–738.
Pessa et al., "Atomic Layer Epitaxy . . . ," J. Appl. Phys. 54(10), Oct. 1983, pp. 6047–6050.
H. Ohno, E. Ikeda, and H. Hasegawa "Planar Doping by Interrupted MOVPE Growth of GaAs" Journal of Crystal Growth 68 (1984) 15–20.
S. Sasa, S. Muto, K. Kondo, H. Ishikawa, and S. Hiyamizu "Si Atomatic-Planar-Doping in GaAs Made by Molecular Beam Epitaxy" Japanese Journal of Applied Physics vol. 24 No. 8 Aug. 1985 pp. L602–L604.
E. F. Schubert, A. Fischer, and K. Ploog, "The Delta-Doped Field-Effect Transistor ($\delta$FET)" IEEE Transactions on Electron Devices, vol. ED-33, No. 5 May 1986.
A. Usui, and H. Sunakawa, "GaAs Atomic Layer Epitaxy by Hydride VPE" Japanese Journal of Applied Physics vol. 35, No. 3, Mar., 1986 pp. L212–L214.
T. Suntola, "Atomic Layer Epitaxy" Extended Extracts of the 16th (1984 International) Conference on Solid State Devices and Materials, Kobe, 1984, pp. 647–650.

Primary Examiner—Brian E. Hearn
Assistant Examiner—William D. Bunch
Attorney, Agent, or Firm—Helfgott & Karas

[57] ABSTRACT

A method of producing n-type III-V compound semiconductor comprises growing a plurality of monolayers of III-V compound semiconductor molecules on a III-V compound substrate; growing a single layer of group VI element on the III-V monolayers so as to occupy the lattice points for group V element by means of Atomic Layer Epitaxy process; decreasing the number of group VI element by exposing the single layer to the gas of group V element; and growing a plurality of monolayers of III-V compound semiconductor molecules on the group VI element-doped layer by means of the Atomic Layer Epitaxy process.

11 Claims, 2 Drawing Sheets

GROUP VI DOPING OF III-V SEMICONDUCTORS DURING ALE

BACKGROUND OF THE INVENTION

The present invention relates to a method of growing a planar-doped epitaxial layer structure of III-V compound semiconductors and more particularly to a method of controlling the carrier concentration thereof.

In a conventional planar-doped structure as reported in IEEE Transaction on Electron Devices, Vol. ED-33, No. 5, May 1986, pp. 625-632, only a selected layer of GaAs is doped with silicon (Si) as an n-type impurity element while the GaAs epitaxial layer is grown by molecular beam epitaxy (MBE). However, it is extremely difficult to define the doping position in the order of atomic layer thickness at an arbitrary depth when the epitaxial growth is resorted to the MBE technique, and thus its reproducibility is poor.

To this end, the present applicant proposed a new planar doping technique by using Atomic Layer Epitoxy (ALE) in the co-pending U.S. Pat. application filed on Mar. 28, 1988.

This new planar doping technique for producing n-type III-V compound semiconductor comprises a first step of growing a plurality of monolayers of III-V compound semiconductor molecules on a III-V compound substrate; a second step of growing a single layer of group VI element such as Selenium (Se) on the III-V monolayers so as to occupy the lattice points for group V element by means of ALE process; and a third step of growing a plurality of monolayer of III-V compound semiconductor molecules on the group VI element-doped layer by means of ALE process.

According to this method, position of the planar-doped layer can be controlled with a precise reproducibility.

On the other hand, the carrier concentration of Se-doped planar layer was controlled by the growth temperature. However, the temperature exceeds more than 550° C., the carrier concentration decreases rapidly. In the same manner, when the temperature becomes less than 420° C., the carrier concentration is decreased rapidly too. Accordingly, although the large value of the concentration can be achieved with a good reproducibility, it is difficult to obtain a lower carrier concentration with a good reproducibility. So long as the value of the concentration is resorted to the temperature control, wide range of the concentration cannot be obtained stably.

SUMMARY OF THE INVENTION

The object of the present invention is to provide a new method of controlling the carrier concentration of planar doping layer in a wide range for n-type III-V compound semiconductor.

According to the present invention, there is provided a method of producing a group VI element-doped III-V compound semiconductor which comprises a first step of growing a plurality of monolayers of III-V compound semiconductor molecules on a III-V compound substrate; a second step of growing a single layer of group VI element on the III-V monolayers so as to occupy the lattice points for group V element by means of Atomic Layer Epitaxy process; a third step of exposing the single layer of group VI element to group V element gas; and a fourth step of growing a plurality of monolayers of III-V compound semiconductor molecules on the group VI element-doped layer by means of the Atomic Layer Epitaxy process.

As for the IV-V compound semiconductors, GaAs, InP, GaP and InAs are preferable and selenium (Se) and sulfur (S) are preferred to be used as the group VI element.

More specifically, instead of adopting group IV element such as Si, group VI element such as Se is used as an impurity element and Se monolayer is grown by ALE. Prior to Se doping step, GaCl monolayer is adsorbed on the As monolayer, and then $H_2Se$ gas is provided to adsorb Se onto Ga by desorbing Cl as HCl gas from GaCl monolayer. Then the Se-doped monolayer is exposed to control gas of $AsH_3$ so as to decrease the Se atom in the Se-doped monolayer by replacing part of Se atoms into As atoms. After this Se-As replacing step, conventional GaAs ALE is performed again to sandwich the Se-doped monolayer between GaAs monolayers.

According to the present invention, the control of the carrier concentration is easily achieved with a good reproducibility.

DESCRIPTION OF THE PREFERRED EMBODIMENTS

The following examples are given to further illustrate the present invention. The scope of the invention and the field of its application are not, however, limited by these examples.

EXAMPLE 1

Figure 1:
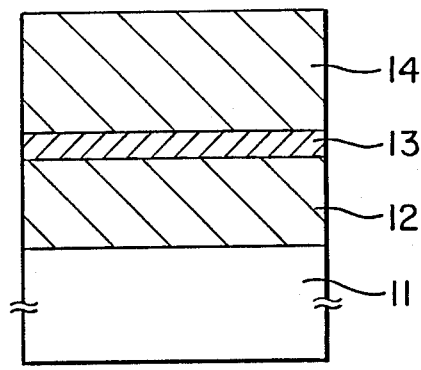
FIG. 1 shows a cross-sectional view of basic structure having a single planar-doped epitaxial crystal according to the present invention.
Figure 2:
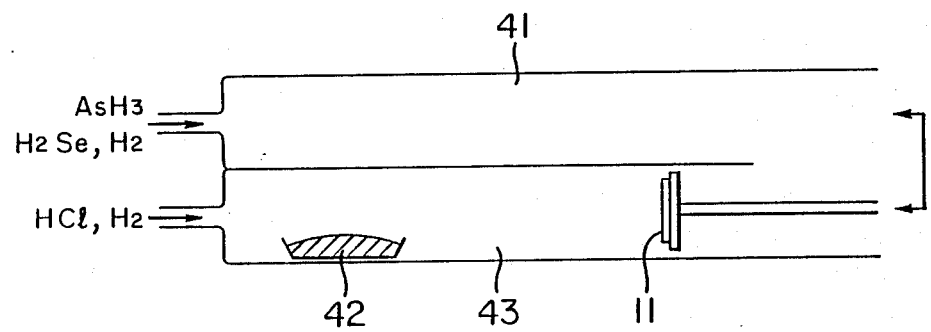
FIG. 2 shows a dual-growth chamber used in this invention.

Referring to FIG. 1, a Se-doped monolayer 13 is inserted into GaAs ALE structure by means of ALE with dual-growth-chamber as shown in FIG. 2. The principle of the ALE is described by Tuomo Suntola in "Extended Abstract of the 16th (1984) International Conference on Solid Devices and Materials, Kobe, pp. 647-650". A GaAs epitaxial structure grown by the ALE, is also reported by A. Usui et al. in " Japanese Journal of Applied Physics, vol. 25, No. 3, March, 1986, pp. L212-L214".

A semi-insulating (10°) GaAs substrate is used as a substrate crystal 11. At first, substrate 11 is located in the chamber 41 and heated to a growth temperature of 450° C. After the temperature of the chambers reached the growth temperature, HCl gas is introduced along with $H_2$ carrier gas into chamber 43 wherein Ga source 42 is located to generate GaCl gas. The flow rates of HCl and $H_2$ are 1 cc per minute and 4700 cc per minute, respectively. When the atmosphere becomes stable, the substrate 11 is transferred from chamber 41 to chamber 43. After exposing the substrate 11 to GaCl gas for about ten seconds, the substrate 11 is transferred to the chamber 41. Then a first $AsH_3$ gas is introduced along with $H_2$ carrier gas into the chamber 41. The flow rate of the first $AsH_3$ gas is 5 cc per minute and the substrate 11 is exposed to the first AsH₃ gas for about ten seconds to grow a monolayer of GaAs molecule. The foregoing first process is repeated and GaAs region 12 consisting of 35 monolayers of GaAs molecule is grown.

After that, the substrate 11 is transferred into the chamber 43 to adsorb the GaCl molecular layer on As monolayer, and then the substrate 11 is transferred into the chamber 41 wherein the first AsH₃ gas is changed to H₂Se gas. The flow rate of the H₂Se gas is 0.2 cc per minute and exposure time is about 10 seconds to grow Se-doped monolayer 13.

Figure 3:
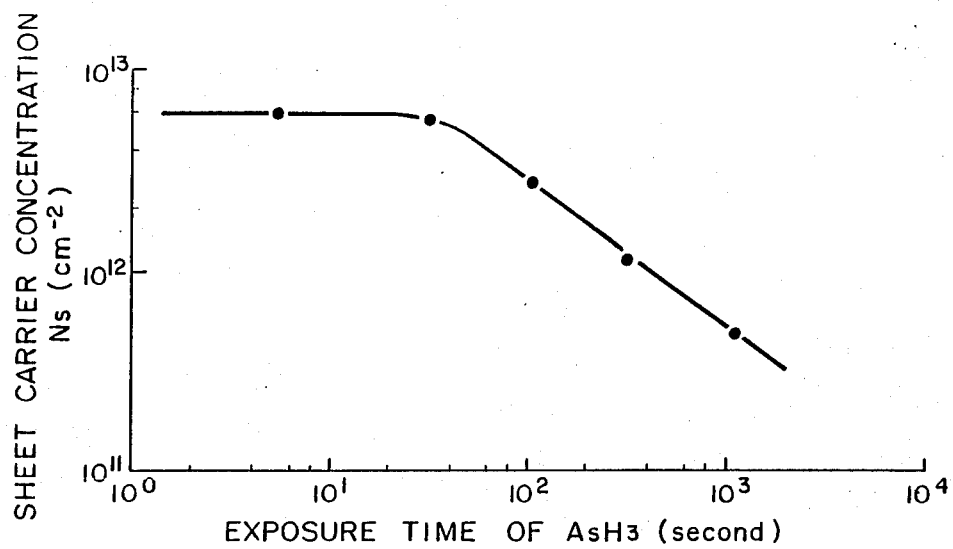
FIG. 3 shows the relationship between exposure period and sheet carrier concentration.

Then the H₂Se gas is again changed to a second AsH₃ gas in the chamber 41 to expose the substrate 11 to the control gas of AsH₃. The flow rate of the second AsH₃ gas is 5 cc per minute and its exposure time is 300 seconds. The exposure time of the second AsH₃ gas is determined to meet the desired carrier concentration as shown in FIG. 3.

After that, 105 layers of GaAs monolayers 14 are grown by ALE on the Se-doped monolayer 13.

The sheet carrier concentration of this obtained GaAs structure is measured by hall measurement (Van der pauw method). In this example, as shown in FIG. 3, when the exposure time of the second AsH₃ gas is varied from 5 to 1000 seconds while its flow rate is kept constant at 5 cc per minute, the sheet carrier concentration of the Se-doped GaAs crystal varies from about $6 \times 10^{12} cm^{-2}$ to about $0.5 \times 10^{12} cm^{-2}$.

Therefore, a wide range of sheet carrier concentrations is achieved easily by only controlling the exposure time. Needless to say, time control is easier than temperature control. Furthermore, since the carrier concentration decreases slowly, the reproducibility is good.

EXAMPLE 2

In this example, the flow rate of the second AsH₃ gas is varied from 0.2 cc/min. to 5 cc/min. while the exposure period of AsH₃ gas is maintained at 300 seconds. Other growth condition is the same as in the case of Example 1. As is shown in FIG. 4, the sheet carrier concentration can be decreased from about $6 \times 10^{12} cm^{-2}$ to about $0.5 \times 10^{12} cm^{-2}$.

Figure 4:
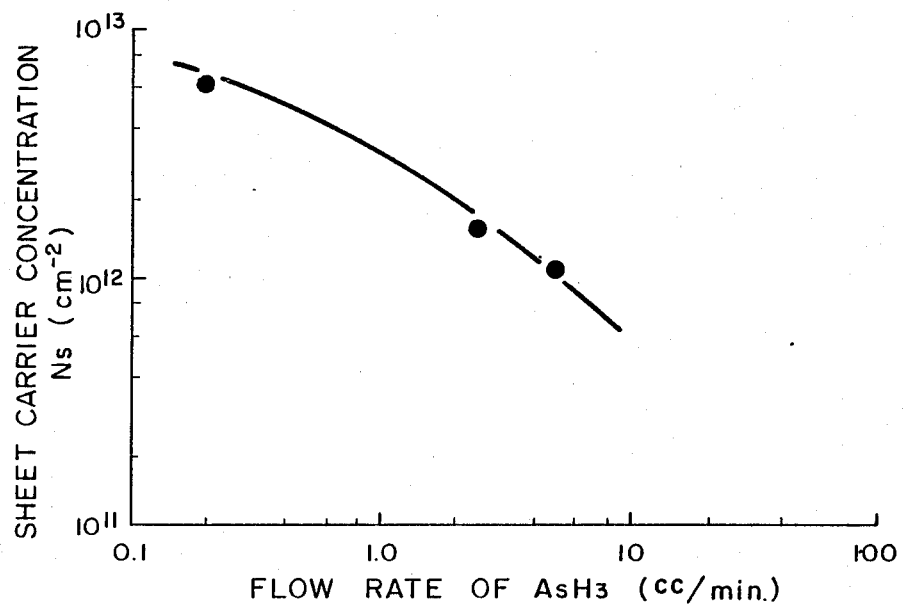
FIG. 4 shows the relationship between the flow rate of $AsH_3$ gas and the sheet carrier concentration.

From FIG. 3 and FIG. 4, it is understandable that the sheet carrier concentration can be controlled by changing either the exposure period or flow rate of AsH₃ gas provided onto Se-doped planar layer. Since the time control is easy to practice, the controlling of the exposure period of AsH₃ gas is more desirable than flow rate control. In view of a good reproducibility, it is preferable to choose the flow rate of the second AsH₃gas between 1 cc/min. and 10 cc/min. while choosing its exposure period between 200 sec. and 300 sec.

The growth condition is not limited to the above stated cases. According to the ALE technique, the layer thickness hardly need be changed even if the flow rate of respective gas other than second AsH₃ gas were reduced to lower values such as 0.1 cc/min for HCl (Ga), 1 cc/min. for the first AsH₃, 0.01 cc/min. for H₂Se and 500 cc/min. for H₂. There is no upper limit, but in view of economical reason or so, desirable range of the flow rate are as follows:

HCl (Ga) : 0.2–5 cc/min.
The first AsH₃ : 3–25 cc/min.
H₂Se : 0.02–1 cc/min.
H₂ : 1000–10000 cc/min.

Furthermore, the layer thickness hardly need be changed even if the exposure time of about 10 seconds were reduced to about one second, which is enough time to adsorb the atoms. Although the carrier concentration of the Se-doped planar layer is easily changed by the AsH₃ gas, that is hardly changed by flow rate and exposure time of H₂Se gas.

In Example 1, the process of exposing Se-doped layer to the GaCl gas prior to second AsH₃ gas exposure can be eliminated.

Other III-V compound such as InP, GaP,. InAs can be expected to be applied to the same process of the foregoing examples. As for InP, for example, InP substrate is used instead of GaAs substrate. Ga source in FIG. 2 is replaced by In and AsH₃ gas is replaced by PH₃ gas.

With respect to the doping element of Group VI, sulfur (S) may be used instead of Se. Thus H₂S gas is used instead of H₂Se of Example 1. Other growth condition are the same as in the case of example 1.

As is described above, the location of planar doping can be strictly controlled in the order of single atomic layer or single molecular layer, and furthermore, group VI element doping with wide range value of carrier concentration can be effectively controlled with good reproducibility.

What is claimed is:

1. Method of producing n-type III-V compound semiconductor comprising:
   a first step of growing a plurality of monolayers of III-V compound semiconductor molecules on a III-V compound substrate;
   a second step of growing a single layer of group VI element on said III-V monolayers so as to occupy lattice points for group V element by means of Atomic Layer Epitaxy process;
   a third step of decreasing the number of said group VI element by exposing said single layer to the gas of group V element; and
   a fourth step of growing a plurality of monolayers of III-V compound semiconductor molecules on the group VI element-doped layer by means of said Atomic Layer Epitaxy process.

2. Method according to claim 1, wherein said III-V compound semiconductor is selected from the group comprising GaAs, InP, Gap and InAs, while said group VI element is selected from the group comprising Se and S.

3. Growing method of Se-doped n-type GaAs crystal comprising:
   a first step of adsorbing a monolayer of GaCl molecule onto GaAs substrate by exposing thereof to GaCl gas.
   a second step of exposing said substrate to AsH₃ gas to grow As monolayer onto Ga monolayer by desorbing Cl from a GaCl molecule as HCl gas;
   a third step of repeating said first step and second step consequently to grow a desired number of monolayers of GaAs molecule;
   a fourth step of adsorbing a monolayer of GaCl molecule onto said monolayers of GaAs molecule;
   a fifth step of exposing said substrate after said fourth step to H₂Se gas to grow Se monolayer onto Ga monolayer by desorption Cl from said GaCl molecule as HCl gas;
   a sixth step of exposing said substrate after said fifth step to AsH₃ gas to replace part of said Se by As in said Se monolayer;
   a seventh step of growing GaCl monolayer onto said Se monolayer by exposing said substrate after said sixth step to GaCl gas;

an eighth step of exposing said substrate after said seventh step to AsH₃ gas to grow As monolayer onto Ga monolayer;

a ninth step of exposing said substrate after said eighth step to GaCl gas to grow Ga monolayer onto As monolayer; and a tenth step of repeating said seventh step and eighth step alternatively after said ninth step to grow a desired number of monolayers of GaAs molecules 4. Method according to claim 3, wherein said substrate is heated to a temperature of about 450°C. before said first step.

5. Method according to claim 3, wherein time of exposure in said first step is about 10 seconds.

6. Method according to claim 3, wherein time of exposure in said second step is about 10 seconds.

7. Method according to claim 3, wherein time of exposure in said fifth step is about 10 seconds.

8. Method according to claim 3, wherein time of exposure in said sixth step is about 300 seconds.

9. Method according to claim 3, wherein time of exposure in said sixth step is varied from 5 to 1000 seconds.

10. Method according to claim 9, wherein a flow rate of AsH3 gas in said sixth step is maintained constant.

11. Method according to claim 8, wherein a flow rate of Ash3 gas in said sixth step is varied from 0.2cc/min. to 5cc/min.

* * * * *

UNITED STATES PATENT AND TRADEMARK OFFICE
CERTIFICATE OF CORRECTION

PATENT NO. : 4,859,627

DATED : August 22, 1989

INVENTOR(S) : Haruo Sunakawa

It is certified that error appears in the above-identified patent and that said Letters Patent is hereby corrected as shown below:

On the title page, below line "[22] Filed: Jul. 1, 1988" insert

-- [30] Foreign Application Priority Data
January 7, 1987 [JP] Japan ...62-165705--

Signed and Sealed this

Fourth Day of February, 1992

Attest:

HARRY F. MANBECK, JR.

*Attesting Officer*      *Commissioner of Patents and Trademarks*